US009691625B2

(12) United States Patent
Tan et al.

(10) Patent No.: US 9,691,625 B2
(45) Date of Patent: Jun. 27, 2017

(54) METHODS AND SYSTEMS FOR PLASMA ETCHING USING BI-MODAL PROCESS GAS COMPOSITION RESPONSIVE TO PLASMA POWER LEVEL

(71) Applicant: Lam Research Corporation, Fremont, CA (US)

(72) Inventors: Zhongkui Tan, San Jose, CA (US); Qian Fu, Pleasanton, CA (US); Ying Wu, Dublin, CA (US); Qing Xu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/932,265

(22) Filed: Nov. 4, 2015

(65) Prior Publication Data
US 2017/0125253 A1    May 4, 2017

(51) Int. Cl.
*H01L 21/3065* (2006.01)
*H01L 21/308* (2006.01)

(52) U.S. Cl.
CPC ...... *H01L 21/3065* (2013.01); *H01L 21/3081* (2013.01)

(58) Field of Classification Search
None
See application file for complete search history.

(56) References Cited

U.S. PATENT DOCUMENTS

| | | | |
|---|---|---|---|
| 5,874,362 A * | 2/1999 | Wong | H01L 21/3065 252/79.1 |
| 6,380,095 B1 * | 4/2002 | Liu | H01L 21/3065 257/E21.218 |
| 6,635,185 B2 * | 10/2003 | Demmin | H01L 21/30604 134/1.1 |
| 7,169,695 B2 * | 1/2007 | Huang | H01L 21/31116 257/E21.252 |
| 2001/0045354 A1 * | 11/2001 | Wang | H01L 21/3065 204/192.37 |
| 2012/0205774 A1 * | 8/2012 | Wang | H01L 29/0649 257/506 |
| 2013/0244440 A1 * | 9/2013 | McChesney | H01J 37/321 438/719 |

(Continued)

*Primary Examiner* — Shamim Ahmed
(74) *Attorney, Agent, or Firm* — Martine Penilla Group, LLP

(57) ABSTRACT

A substrate is disposed on a substrate holder within a process module. The substrate includes a mask material overlying a target material with at least one portion of the target material exposed through an opening in the mask material. A bi-modal process gas composition is supplied to a plasma generation region overlying the substrate. For a first period of time, a first radiofrequency power is applied to the bi-modal process gas composition to generate a plasma to cause etching-dominant effects on the substrate. For a second period of time, after completion of the first period of time, a second radiofrequency power is applied to the bi-modal process gas composition to generate the plasma to cause deposition-dominant effects on the substrate. The first and second radiofrequency powers are applied in an alternating and successive manner for an overall period of time to remove a required amount of exposed target material.

20 Claims, 8 Drawing Sheets

(56) References Cited

U.S. PATENT DOCUMENTS

2015/0034592 A1\* 2/2015 Huff .................... H01J 37/3211
216/41
2016/0133530 A1\* 5/2016 Sonoda .................. H01L 22/26
438/10

\* cited by examiner

METHODS AND SYSTEMS FOR PLASMA ETCHING USING BI-MODAL PROCESS GAS COMPOSITION RESPONSIVE TO PLASMA POWER LEVEL

BACKGROUND

1. Field of the Invention

The present invention relates to semiconductor device fabrication.

2. Description of the Related Art

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma are affected by many process parameters including, but not limited to, material composition of the process gas, flow rate of the process gas, geometric features of the plasma generation region and surrounding structures, temperatures of the process gas and surrounding materials, frequency and magnitude of the RF power applied, and bias voltage applied to attract charged constituents of the plasma toward the substrate, among others. It is of interest to understand and control some of the process parameters that may affect how the generated plasma interacts with the substrate. It is within this context that the present invention arises.

SUMMARY

In one example embodiment, a method is disclosed for plasma etching of a target material in semiconductor fabrication. The method includes an operation (a) for disposing a substrate on a substrate holder within a process module. The substrate includes a mask material overlying a target material with at least one portion of the target material exposed through an opening in the mask material. The method also includes an operation (b) for supplying a bi-modal process gas composition to a plasma generation region overlying the substrate. The method also includes an operation (c) in which, for a first period of time, a first radiofrequency power is applied to the bi-modal process gas composition within the plasma generation region to generate a plasma in exposure to the substrate. The plasma generated through application of the first radiofrequency power causes etching-dominant effects on the substrate. The method also includes an operation (d) in which, for a second period of time after completion of the first period of time, a second radiofrequency power is applied to the bi-modal process gas composition within the plasma generation region to generate the plasma in exposure to the substrate. The second radiofrequency power is applied instead of the first radiofrequency power. The plasma generated through application of the second radiofrequency power causes deposition-dominant effects on the substrate. The method also includes an operation (e) for repeating operations (c) and (d) in an alternating and successive manner for an overall period of time necessary to remove a required amount of the target material exposed on the substrate.

In one example embodiment, a method is disclosed for plasma etching of a target material in semiconductor fabrication. The method includes an operation (a) for disposing a substrate on a substrate holder within a process module. The substrate includes a mask material overlying a target material with at least one portion of the target material exposed through an opening in the mask material. The method also includes an operation (b) for supplying a bi-modal process gas composition to a plasma generation region overlying the substrate. The method also includes an operation (c) in which, for a first period of time, a first radiofrequency power is applied to the bi-modal process gas composition within the plasma generation region to generate a plasma in exposure to the substrate. The plasma generated through application of the first radiofrequency power causes etching-dominant effects on the substrate. Also, during operation (c), a bias voltage is applied at the substrate holder at a first bias voltage setting corresponding to a high bias voltage level. The method also includes an operation (d) in which, for a second period of time after completion of the first period of time, a second radiofrequency power is applied to the bi-modal process gas composition within the plasma generation region to generate the plasma in exposure to the substrate. The second radiofrequency power is applied instead of the first radiofrequency power. The plasma generated through application of the second radiofrequency power causes deposition-dominant effects on the substrate. Also, in operation (d), the bias voltage is reduced at the substrate holder to a second bias voltage setting corresponding to a low bias voltage level. The method also includes an operation (e) for repeating operations (c) and (d) in an alternating and successive manner for an overall period of time necessary to remove a required amount of the target material exposed on the substrate.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Methods and systems are disclosed herein for improvement in plasma etching of material from a substrate in a semiconductor device fabrication process. In an example embodiment, the term substrate as used herein refers to a semiconductor wafer. However, it should be understood that in other embodiments, the term substrate as used herein can refer to substrates formed of sapphire, GaN, GaAs or SiC, or other substrate materials, and can include glass panels/substrates, metal foils, metal sheets, polymer materials, or the like. Also, in various embodiments, the substrate as referred to herein may vary in form, shape, and/or size. For example, in some embodiments, the substrate as referred to herein may correspond to a 200 mm (millimeters) semiconductor wafer, a 300 mm semiconductor wafer, or a 450 mm semiconductor wafer. Also, in some embodiments, the substrate as referred to herein may correspond to a non-circular substrate, such as a rectangular substrate for a flat panel display, or the like, among other shapes.

Figure 1A:
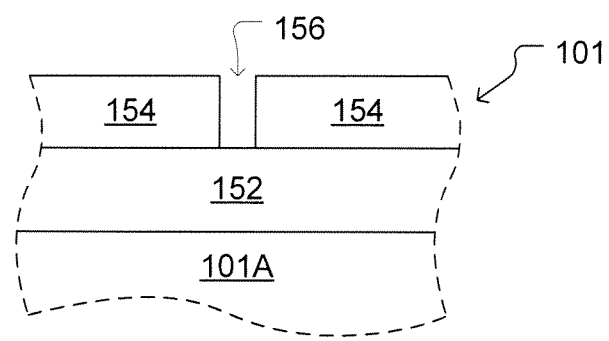
FIG. 1A shows a vertical cross-section through a portion of an example substrate prepared for a plasma etching process, in accordance with some embodiments of the present invention.

FIG. 1A shows a vertical cross-section through a portion of an example substrate 101 prepared for a plasma etching process, in accordance with some embodiments of the present invention. It should be understood that the substrate 101 is built up of multiple layers of different conductor and insulator/dielectric materials of specific shapes to form transistor devices and wires connecting various terminals and gates of the transistors devices so as to form a prescribed integrated circuit. For ease of description, base 101A of the substrate 101 represents this collective build-up of multiple layers of different materials to a particular point at which additional structures are to be formed.

FIG. 1A shows a layer of a target material 152 disposed over the base 101A of the substrate 101, with a layer of a mask material 154 disposed over the target material 152. An opening 156 is formed through the mask material 154 to expose an area of the underlying target material 152. With this configuration, a plasma etching process is performed to remove a portion of the target material 152 exposed at the bottom of the opening 156.

Figure 1B:
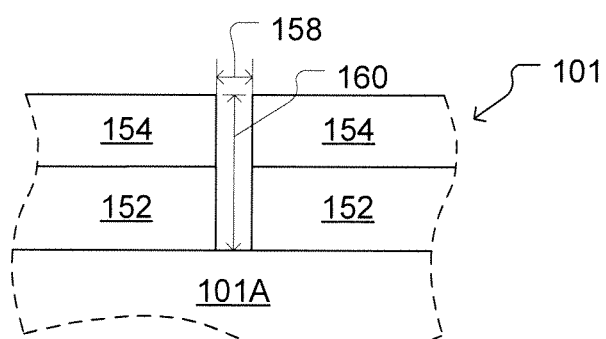
FIG. 1B shows the vertical cross-section through the portion of the example substrate from FIG. 1A, following performance of the plasma etching process.

FIG. 1B shows the vertical cross-section through the portion of the example substrate 101 from FIG. 1A, following performance of the plasma etching process. FIG. 1B shows removal of the portion of the target material 152 that was exposed through the opening 156 to the plasma etching process. The opening corresponding to the removed portion of the target material 152 has an overall opening height 160 extending through both the mask material 154 and the target material 152 and an opening width 158. The opening width 158 may correspond to a critical dimension (CD) of an integrated circuit layout. The ratio of the opening height 160 to the opening width 158 defines an aspect ratio of the opening.

In modern semiconductor device fabrication, high aspect ratio (HAR) etching has become a significant challenge. For example, in conductor etching processes, HAR etching of carbon is a particular challenge, but just one of many extant HAR-related challenges. In HAR etching processes, a trade-off is generally made between etch rate of the target material 152 and etching selectivity of the target material 152 relative to the mask material 154 overlying the target material 152. More specifically, it may be necessary to sacrifice some amount of etching selectivity of the target material 152 relative to the overlying mask material 154 in order to increase etch rate of the target material 152. Also, in some etching processes, a higher bias voltage is applied at the substrate 101 level to attract charged constituents, e.g., ions, from the plasma toward the substrate 101 in a more direct manner in order to achieve a faster etch rate of the target material 152 and correspondingly better aspect ratio dependent etch (ARDE) of the target material 152. However, in some processes, etching selectivity of the target material 152 relative to the mask material 154 can drop off rapidly with application of increasing bias voltage at the substrate 101 level, thereby causing rapid loss of the overlying mask material 154.

Methods are disclosed herein in which the plasma process switches between an etching-dominant process state and a deposition-dominant process state in accordance with variation in RF power applied to generate the plasma, and while using a same process gas composition for generation of the plasma in each process state. In this sense, the process gas composition is referred to as a bi-modal process gas composition. When operating in the etching-dominant process state, the target material 152 is etched and mask material 154 is also removed. When operating in the deposition-dominant process state, new material (such as polymer material as an example) is deposited on the mask material 154 to repair/rebuild the mask material 154. Some target material 152 may be etched during the deposition-dominant process state, but the majority of target material 152 etching occurs during the etching-dominant process state.

Figure 2:
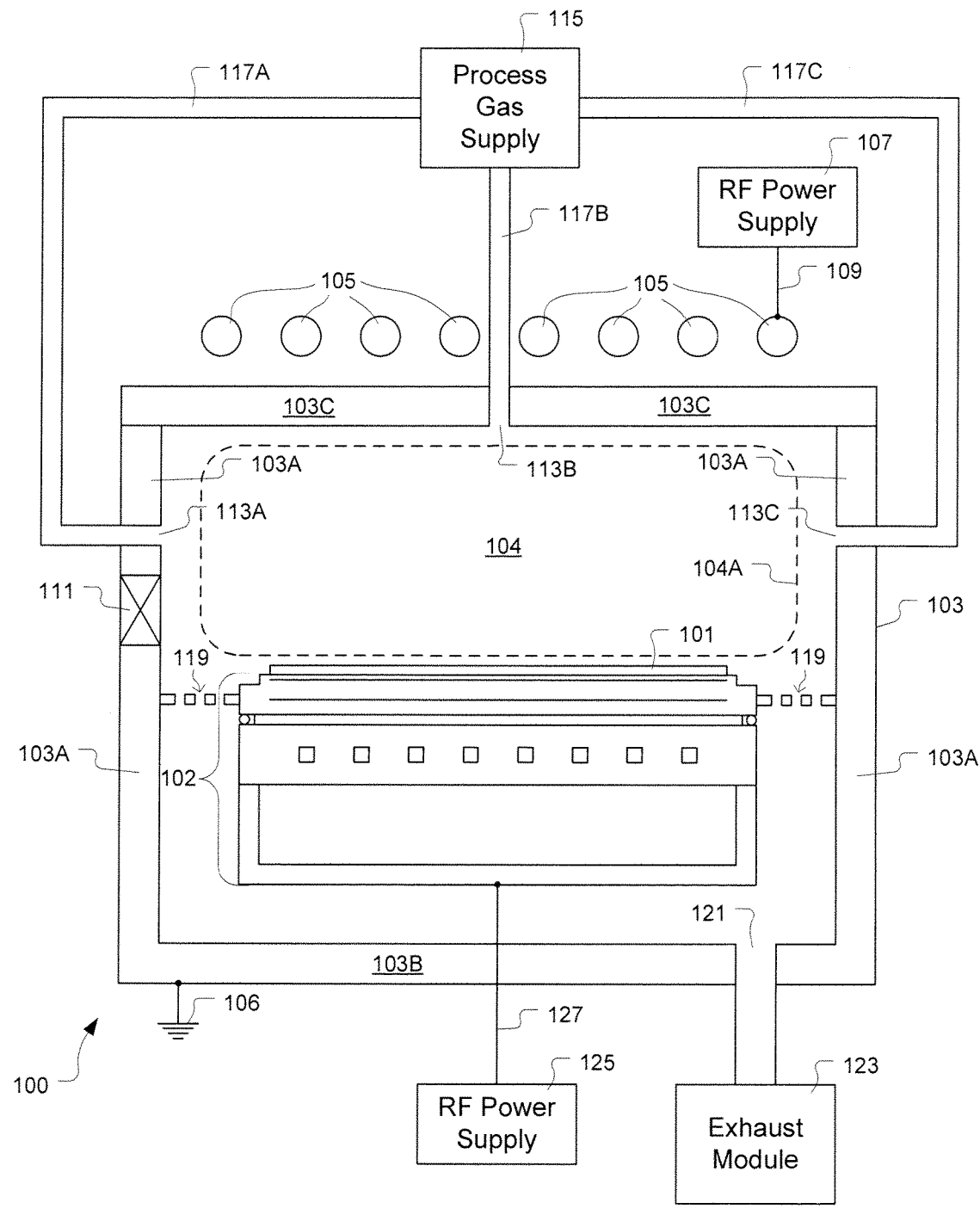
FIG. 2 shows an example substrate process module, in accordance with various embodiments of the present invention.

FIG. 2 shows an example substrate process module 100, in accordance with various embodiments of the present invention. The process module 100 includes a substrate holder 102 configured to hold the substrate 101 in exposure to a plasma generation region 104A in which a plasma 104 is generated. The present disclosure primarily concerns apparatuses, systems, and methods by which one or more process parameters of bias voltage, primary plasma power, and bias voltage RF signal frequency are systematically controlled to improve HAR etching of the target material 152 without compromising the overlying mask material 154. To provide example context, the process module 100 is depicted as an inductively coupled plasma (ICP) process module. However, it should be understood that in other embodiments the process module 100 can be defined as other types of process modules used in semiconductor fabrication.

The process module 100 is configured to provide for exposure of the substrate 101 to a plasma-based processing operation in order to modify characteristics of the substrate 101 in a prescribed and controlled manner. The process module 100 includes a chamber 103 defined by surrounding structures, including one or more wall structures 103A, a bottom structure 103B, and a top structure 103C. In some embodiments, the top structure 103C is formed of a material through which RF signals can be transmitted, such as quartz or ceramic, among others. The chamber 103 can be formed of an electrically conductive material and have an electrical connection to a reference ground potential 106.

The process module 100 includes a coil assembly 105 disposed above the top structure 103C. An RF power supply 107 is connected to supply RF power (RF signals) to the coil assembly 105 through a connection 109. The RF power supplied to the coil assembly 105 is referred to as primary plasma power herein. In various embodiments, the primary plasma power can extend up to about 6000 Watts (W), or even higher. In various embodiments, the RF power supply 107 includes one or more RF generators and associated impedance matching circuitry to provide for proper transmission of the RF power to coil assembly 105.

In various embodiments, the RF power supply 107 can include one or more RF signal generators operating at one or more frequencies. Multiple RF signal frequencies can be supplied to the coil assembly 105 at the same time. In some embodiments, signal frequencies output by the RF power supply 107 are set within a range extending from 1 kHz (kiloHertz) to 100 MHz (megaHertz). In some embodiments, signal frequencies output by the RF power supply 107 are set within a range extending from 400 kHz to 60 MHz. In some embodiments, the RF power supply 107 is set to generate RF signals at frequencies of 2 MHz, 27 MHz, and 60 MHz. In some embodiments, the RF power supply 107 is set to generate one or more high frequency RF signals within a frequency range extending from about 1 MHz to about 60 MHz, and generate one or more low frequency RF signals within a frequency range extending from about 100 kHz to about 1 MHz. It should be understood that the above-mentioned RF signal frequency ranges are provided by way of example. In practice, the RF power supply 107 can be configured to generate essentially any RF signal having essentially any frequency as needed to generate the plasma 104 within the plasma generation region 104A. Additionally, the RF power supply 107 can include frequency-based filtering, i.e., high-pass filtering and/or low-pass filtering, to ensure that specified RF signal frequencies are transmitted to the coil assembly 105.

In some embodiments, the process module 100 includes a closable access port 111, such as a gate valve or other component, through which the substrate 101 can be transferred into and out of the chamber 103. The process module 100 also includes a number of process gas supply ports 113A, 113B, 113C through which one or more process gas composition(s) can be supplied to the interior region of the chamber 103 overlying the substrate holder 102. During operation, a process gas supply 115 operates to deliver the one or more process gas composition(s) through one or more connection lines 117A, 117B, 117C to the process gas supply ports 113A, 113B, 113C, respectively, and RF power is delivered from the RF power supply 107 to the coil assembly 105, such that the RF power generates an electromagnetic field within a plasma generation region below the top structure 103C and overlying the substrate holder 102 so as to transform the one or more process gas composition(s) within the plasma generation region 104A into the plasma 104. Then, reactive constituents of the plasma 104, such as ions and/or radicals, interact with portions of the exposed surfaces of the substrate 101. The process module 100 includes a number of side vent structures 119 through which gases and by-product materials can flow to an exhaust port 121, which is connected to an exhaust module 123 configured to apply a negative pressure to the interior of the chamber 103 to facilitate exhaust of the used process gases and by-product materials.

Also, in some embodiments, the substrate holder 102 is configured to receive bias RF power from a bias RF power supply 125 through a connection 127 to provide for generation of a bias voltage on the substrate holder 102 in order to attract ions from the plasma 104 toward the substrate holder 102 and substrate 101 held thereon. In various embodiments, the bias voltage generated on the substrate holder 102 can extend up to 5000 Volts (V), or even higher. In various embodiments, the RF power supply 125 includes one or more RF generators and associated impedance matching circuitry to provide for proper transmission of the RF power to substrate holder 102.

In various embodiments, the RF power supply 125 can include one or more RF signal generators operating at one or more frequencies. Multiple RF signal frequencies can be supplied to the substrate holder 102 at the same time. In some embodiments, signal frequencies output by the RF power supply 125 are set within a range extending from 1 kHz (kiloHertz) to 100 MHz (megaHertz). In some embodiments, signal frequencies output by the RF power supply 125 are set within a range extending from 400 kHz to 60 MHz. In some embodiments, the RF power supply 125 is set to generate RF signals at frequencies of 2 MHz, 27 MHz, and 60 MHz. In some embodiments, the RF power supply 125 is set to generate one or more high frequency RF signals within a frequency range extending from about 1 MHz to about 60 MHz, and generate one or more low frequency RF signals within a frequency range extending from about 100 kHz to about 1 MHz. It should be understood that the above-mentioned RF signal frequency ranges are provided by way of example. In practice, the RF power supply 125 can be configured to generate essentially any RF signal having essentially any frequency as needed to generate a prescribed bias voltage at the substrate 101. Additionally, the RF power supply 125 can include frequency-based filtering, i.e., high-pass filtering and/or low-pass filtering, to ensure that specified RF signal frequencies are transmitted to the substrate holder 102.

Although the process module 100 depicts an example of an ICP process module, in various embodiments, the process module 100 can be essentially any type of process module used in semiconductor device fabrication. For example, in some embodiments, the process module 100 can be a capacitively coupled plasma (CCP) process module in which, instead of the coil assembly 105 used in the ICP process module, the CCP process module includes one or more electrodes disposed within the chamber 103, with RF power delivered to the one or more electrodes. In the CCP process module, the one or more electrodes can include one or more of a top electrode (e.g., a showerhead electrode or solid electrode, among others), a bottom electrode (e.g., an electrostatic chuck or substrate support, among others), and a side electrode (e.g., a peripheral ring-shaped electrode, among others), where the top, bottom, and side electrodes are configured around the plasma generation region. The RF power delivered to the one or more electrodes of the CCP process module is transmitted from the one or more electrodes through the one or more process gas composition(s) present within the plasma generation region to a reference ground potential, and in doing so transforms the one or more process gas composition(s) within the plasma generation region 104A into the plasma 104. Therefore, the RF power delivered to the one or more electrodes of the CCP process module is the primary plasma power as referred to herein.

It should be understood that the ICP and CCP process module examples mentioned above are discussed in a simplified manner for ease of description. In reality, the process module 100, whether ICP, CCP, or some other type, is a complex system that includes many components not described herein. However, what should be appreciated for the present discussion is that the process module 100, regardless of type, includes the substrate holder 102 configured to hold the substrate 101 in a secured manner in exposure to the plasma 104 to enable processing of the substrate 101 to obtain a specific result. Examples of plasma processing operations that may performed by the process module 100 include etching operations, deposition operations, and ashing operations, among others.

As new integrated circuit technology develops, there are more HAR etching applications and ARDE becomes an even greater challenge. In HAR etching, fewer ions can reach the etch front at the bottom of the HAR feature given the reduction in available solid angle for open transit of ions as the aspect ratio increases. Also, in HAR etching, as the aspect ratio increases, ions lose more energy through scattering interactions before reaching the etch front at the bottom the HAR feature. As a result, with increasing aspect ratio in HAR etching, more ions will arrive at the etch front at the bottom of the HAR feature having an insufficient energy to cause activation of the target material and thereby be unable to contribute to etching. Some conventional plasma etching processes demonstrate a significant loss of etch rate in HAR etching applications where the aspect ratio exceeds 10:1.

One approach for dealing with the ARDE issues in HAR etching is to apply an increased bias voltage at the substrate level to cause an increase in directionality of the ions toward the substrate and to cause an increase in ion energy incident upon the substrate, thereby increasing both the number and energy of ions that reach the etch front at the bottom of the HAR feature. However, while increasing bias voltage serves to get ions of higher energy to the etch front at the bottom of HAR features, increasing bias voltage also causes an increase in loss of mask material 154 overlying the target material 152 due to increased sputtering of the mask material 154 by higher energy ions. Therefore, etching selectivity of the target material 152 relative to the mask material 154 can drop off rapidly with application of increasing bias voltage at the substrate 101 level.

In some etching applications, a high voltage bias pulsing (HVBP) etching process is performed with low duty cycles, e.g., less than 50% high voltage bias applied at the substrate 101 level versus zero bias voltage applied, to improve etching selectivity of the target material 152 relative to the mask material 154. However, experience indicates that with HAR geometries, the etch rate of the target material 152 becomes very low (even approaching zero) as the aspect ratio increases when zero bias voltage is present at the substrate 101 level. Additionally, besides the trade-off between etch rate of the target material 152 and etching selectivity of the target material 152 relative to a mask material 154, there can be other issues related to HVBP and/or continuous wave (CW) etching processes, such as difficulty with profile control, hole distortion, and/or top clogging. For example, with thicker mask material layers and smaller critical dimension for next generation three-dimensional NAND devices, improved methods and systems such as those described herein are needed to meet process specifications regarding etch rate, target versus mask selectivity, profile control, hole distortion, and/or top clogging, among others.

In another approach, mixed-mode pulsing (MMP) is used in which the process gas composition is changed between successive pulses, such that in one pulse the process gas composition is formulated to promote etching of the target material and in a next pulse the process gas composition is formulated to promote deposition of more mask material, then in the next pulse the process gas composition is formulated to promote etching of the target material, and so on. However, the change of process gas composition between pulses in the MMP approach can require significant system resources, increase overall process complexity, and increase the time required to complete processing of a substrate.

Methods are disclosed herein in which a single bi-modal process gas composition is applied to generate the plasma for the etching process, where the bi-modal process gas composition is configured to enable transition between an etching-dominant process state and a deposition-dominant process state, and vice-versa, in accordance with variation in RF power applied to generate the plasma, i.e., in accordance with the primary plasma power. The bi-modal process gas composition is of a lean chemistry that is more etch-dominate with less polymer deposition. In some embodiments, the lean chemistry of the bi-modal process gas composition also lowers the activation energy at the etch front to provide for faster etching when the primary plasma power is set to cause the etching-dominant process state. The bi-modal process gas composition includes a combination of one or more etchant species and one or more deposition species that have different dissociation rate responses as a function of applied primary plasma power, such that at one primary plasma power level the bi-modal process gas composition will cause the plasma to exhibit etching-dominant effects on the substrate, and at another primary plasma power level the bi-modal process gas composition will cause the plasma to exhibit deposition-dominant effects on the substrate.

For example, in some embodiments, the bi-modal process gas composition can include a fluorine-based etchant species and a carbon-based deposition species. In these example embodiments, the leanness of the bi-modal process gas composition can be represented by its ratio of carbon-to-fluorine, with more fluorine corresponding to more lean and more etching, and with more carbon corresponding to less lean and more deposition. It should be understood, however, that in other embodiments the bi-modal process gas composition can include etchant species and deposition species other than fluorine and carbon, respectively. For example, in some embodiments, the bi-modal process gas composition can include an oxygen-based etchant species and a silicon-based deposition species. Generally speaking, the bi-modal process gas composition can include any type of etchant species and any type of deposition species, so long as the bi-modal process gas composition causes the corresponding plasma to exhibit deposition-dominant effects on the substrate at one primary plasma power level and exhibit etching-dominant effects on the substrate at another (different) primary plasma power level, and so long as the bi-modal process gas composition is suitable for generating the plasma and capable of reacting in a prescribed manner with each of the mask material 154 and target material 152 on the substrate 101.

Figure 3A:
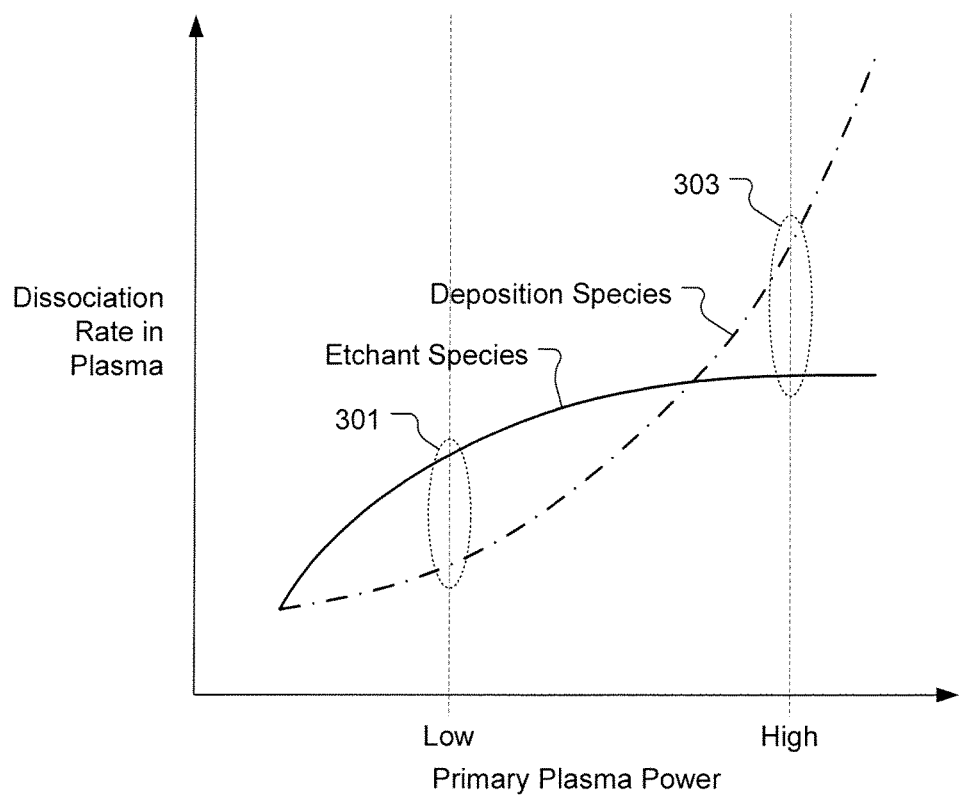
FIG. 3A shows a plot of dissociation rate versus primary plasma power for deposition species and etchant species within an example bi-modal process gas composition configured to provide etching-dominant effects at low primary plasma power and deposition-dominant effects at high primary plasma power, in accordance with some embodiments of the present invention.

FIG. 3A shows a plot of dissociation rate versus primary plasma power for deposition species and etchant species within an example bi-modal process gas composition configured to provide etching-dominant effects at low primary plasma power and deposition-dominant effects at high primary plasma power, in accordance with some embodiments of the present invention. As shown in FIG. 3A, the relative dissociation rates of the etchant species and deposition species at the low primary plasma power is such that the corresponding plasma exhibits etching-dominant effects on the substrate, as indicated by region 301. Also, the relative dissociation rates of the etchant species and deposition species at the high primary plasma power is such that the corresponding plasma exhibits deposition-dominant effects on the substrate, as indicated by region 303. Thus, at the low primary plasma power level, the plasma generated using the bi-modal process gas composition will serve to etch the target material 152. And, at the high primary plasma power level, the plasma generated using the bi-modal process gas composition will serve to deposit material on the mask material 154 so as to repair/rebuild the mask material 154 to compensate for mask material 154 loss that occurred during etching of the target material 152 at the low primary plasma power level.

Figure 3B:
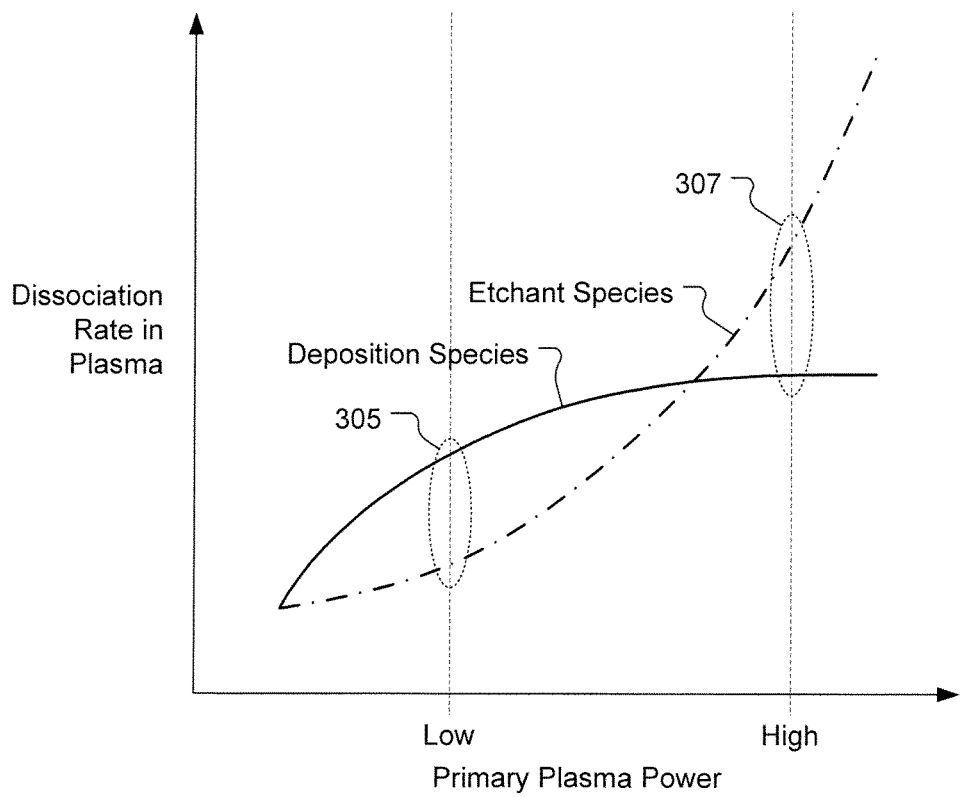
FIG. 3B shows a plot of dissociation rate versus primary plasma power for deposition species and etchant species within an example bi-modal process gas composition configured to provide etching-dominant effects at high primary plasma power and deposition-dominant effects at low primary plasma power, in accordance with some embodiments of the present invention.

FIG. 3B shows a plot of dissociation rate versus primary plasma power for deposition species and etchant species within an example bi-modal process gas composition configured to provide etching-dominant effects at high primary plasma power and deposition-dominant effects at low primary plasma power, in accordance with some embodiments of the present invention. The dissociation rate behavior depicted in FIG. 3B is essentially the reverse of what is shown in FIG. 3A. FIG. 3B shows that the relative dissociation rates of the etchant species and deposition species at the low primary plasma power is such that the corresponding plasma exhibits deposition-dominant effects on the substrate, as indicated by region 305. Also, the relative dissociation rates of the etchant species and deposition species at the high primary plasma power is such that the corresponding plasma exhibits etching-dominant effects on the substrate, as indicated by region 307. Thus, at the high primary plasma power level, the plasma generated using the bi-modal process gas composition will serve to etch the target material 152. And, at the low primary plasma power level, the plasma generated using the bi-modal process gas composition will serve to deposit material on the mask material 154 so as to repair/rebuild the mask material 154 to compensate for mask material 154 loss that occurred during etching of the target material 152 at the high primary plasma power level.

Figure 4A:
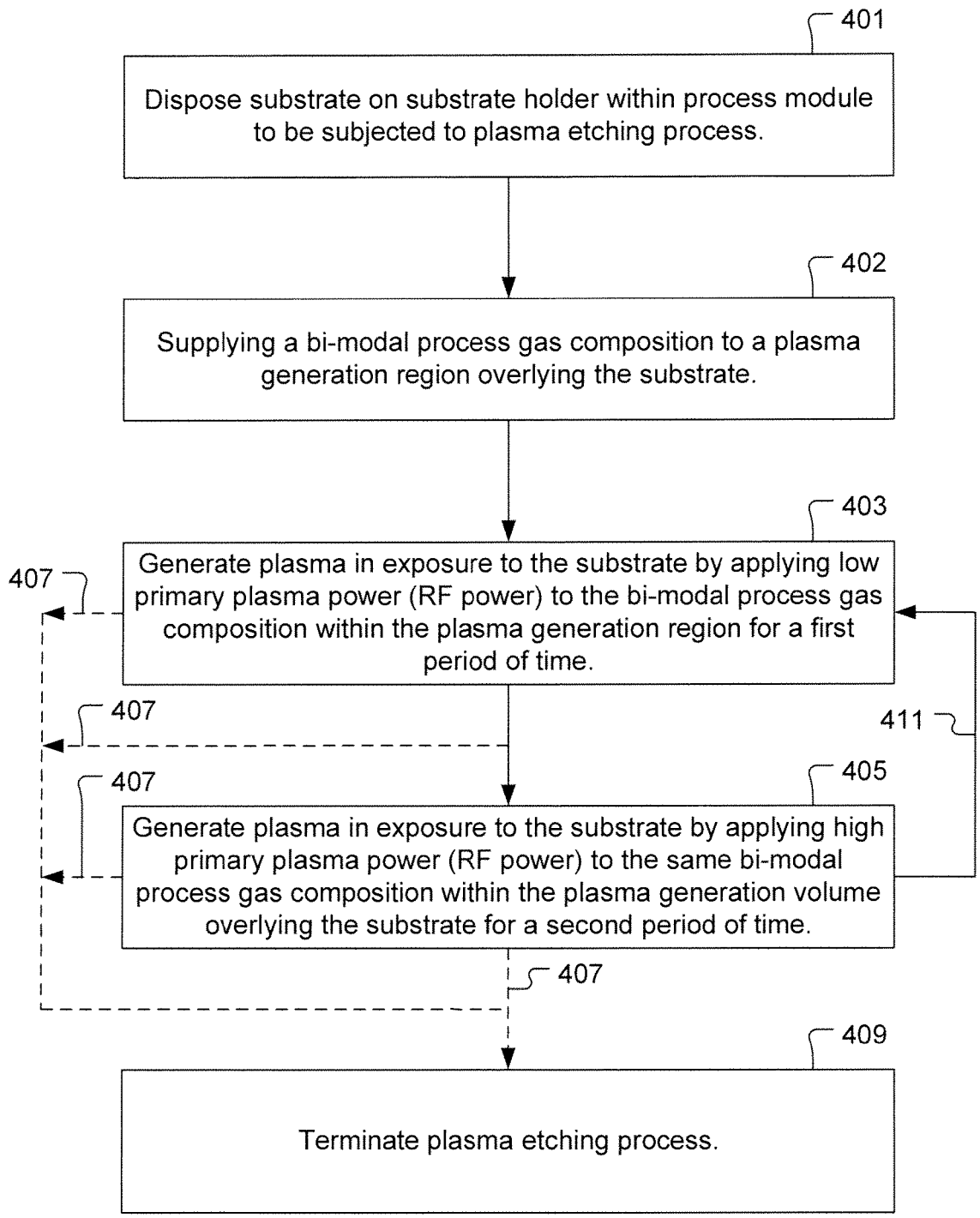
FIG. 4A shows a flowchart of a method for using the bi-modal process gas composition in plasma etching of target material, in accordance with some embodiments of the present invention.

FIG. 4A shows a flowchart of a method for using the bi-modal process gas composition in plasma etching of target material, in accordance with some embodiments of the present invention. With reference to FIG. 2, the method includes an operation 401 in which a substrate 101 is disposed on a substrate holder 102 within a process module 100 to be subjected to a plasma etching process. As exemplified in FIG. 1A, the substrate 101 includes the mask material 154 disposed over the target material 152, with portions of the target material 152 exposed through openings in the mask material 154. The method also includes an operation 402 for supplying the bi-modal process gas composition to the plasma generation region 104A overlying the substrate 101. The method also includes an operation 403 for generating a plasma in exposure to the substrate 101 by applying low primary plasma power (RF power) to the bi-modal process gas composition within the plasma generation region 104A overlying the substrate 101 for a first period of time. In some embodiments, the low primary plasma power applied during operation 403 is within a range extending from about 100 W to about 1000 W. In some embodiments, the low primary plasma power applied during operation 403 is within a range extending from about 300 W to about 600 W. In some embodiments, the low primary plasma power applied during operation 403 is about 500 W. Also, in some embodiments, a duration of the first period of time is within a range extending from about 0.1 millisecond (ms) to about 1000 ms.

Operation 403 corresponds to a first process state that is an etching-dominant process state in which the target material 152 is etched. In the etching-dominant process state of operation 403, some mask material 154 will likely be removed due to the lower etching selectivity of the target material 152 relative to the mask material 154. In some embodiments, the bi-modal process gas composition is configured such that during operation 403 the activation energy at the etch front, i.e., at the exposed target material 152, is essentially zero.

After completion of the operation 403, the method continues with an operation 405 for generating the plasma in exposure to the substrate 101 by applying high primary plasma power (RF power) to the bi-modal process gas composition within the plasma generation region 104A overlying the substrate 101 for a second period of time. It should be understood that the bi-modal process gas composition present in operation 405 is the same bi-modal process gas composition present in operation 403. Therefore, the method of FIG. 4A is not an MMP method in which the process gas composition is changed between process pulses. In some embodiments, the high primary plasma power applied during operation 405 is within a range extending from about 750 W to about 6000 W. In some embodiments, the high primary plasma power applied during operation 405 is within a range extending from about 1000 W to about 4000 W. In some embodiments, the high primary plasma power applied during operation 405 is about 2500 W. Also, in some embodiments, a duration of the second period of time is within a range extending from about 0.1 ms to about 1000 ms.

Operation 405 corresponds to a second process state that is a deposition-dominant process state in which material is deposited on the mask material 154 to repair/rebuild mask material 154 that was removed during the etching-dominant process state of operation 403. In some embodiments, the bi-modal process gas composition is configured such that during operation 405 the activation energy at the etch front, i.e., at the exposed target material 152, is increased relative to its value during operation 403. From operation 405, the method reverts back to operation 403, as indicated by arrow 411, to again apply low primary plasma power (RF power) to the bi-modal process gas composition within the plasma generation region 104A overlying the substrate 101 so as to expose the substrate 101 to the etching-dominant process state in which the target material 152 is etched. As indicated by arrows 407 directed to a termination operation 409, the plasma etching process can be terminated at any time, either during operation 403, or at the end of operation 403, or during operation 405, or at the end of operation 405, when a desired etching of the target material 152 has been achieved.

Figure 4B:
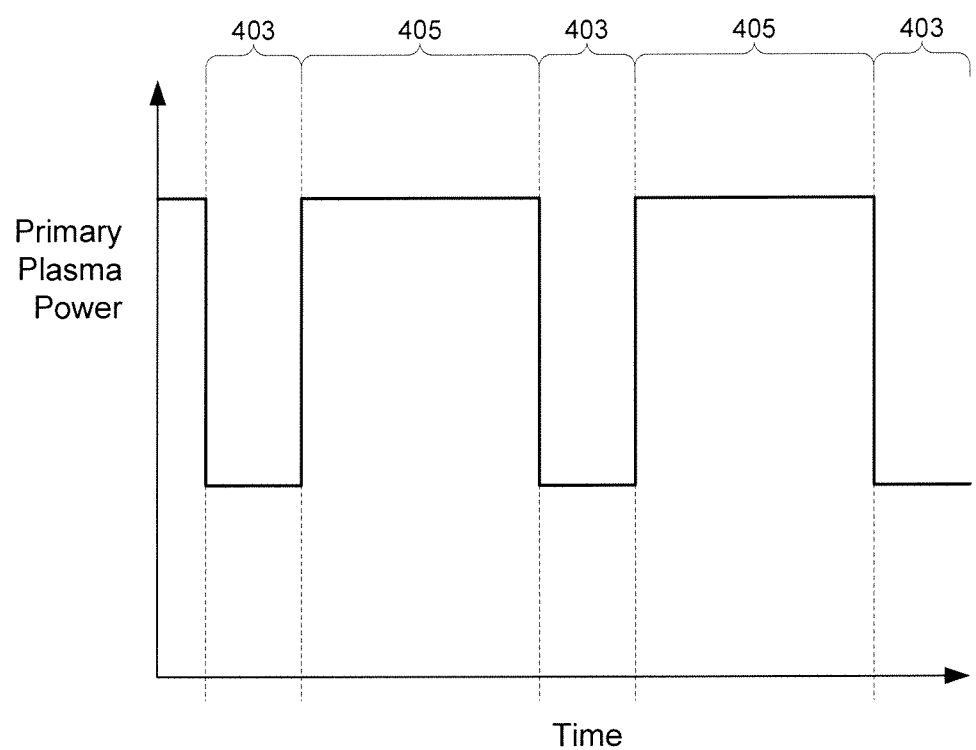
FIG. 4B shows a plot of applied primary plasma power as a function of time in accordance with the method of FIG. 4A, in accordance with some embodiments of the present invention.

FIG. 4B shows a plot of applied primary plasma power as a function of time in accordance with the method of FIG. 4A, in accordance with some embodiments of the present invention. The plot shows the duration of the first period of time in which operation 403 is performed and in which the plasma is in the first process state that is the etching-dominant process state. The plot also shows the duration of the second period of time in which operation 405 is performed and in which the plasma is in the second process state that is the deposition-dominant process state. In this particular example, the first period of time corresponding to the etching-dominant process state is less than the second period of time corresponding to the deposition-dominant process state. This type of duty cycle for etching versus deposition can be utilized in processing applications in which the removal rate of mask material 154 is significant during the etching-dominant process state, such as when a bias voltage is applied at the substrate level during the etching-dominant process state. In some example embodiments, the first period of time corresponding to the etching-dominant process state may be about one-third of the second period of time corresponding to the deposition-dominant process state. However, in other embodiments, the respective durations of the first period of time for the etching-dominant process state and the second period of time for the deposition-dominant process state can be set in essentially any manner necessary to preserve/maintain a sufficient amount of mask material 154 in order to achieve a desired etching result of the target material 152.

Figure 5A:
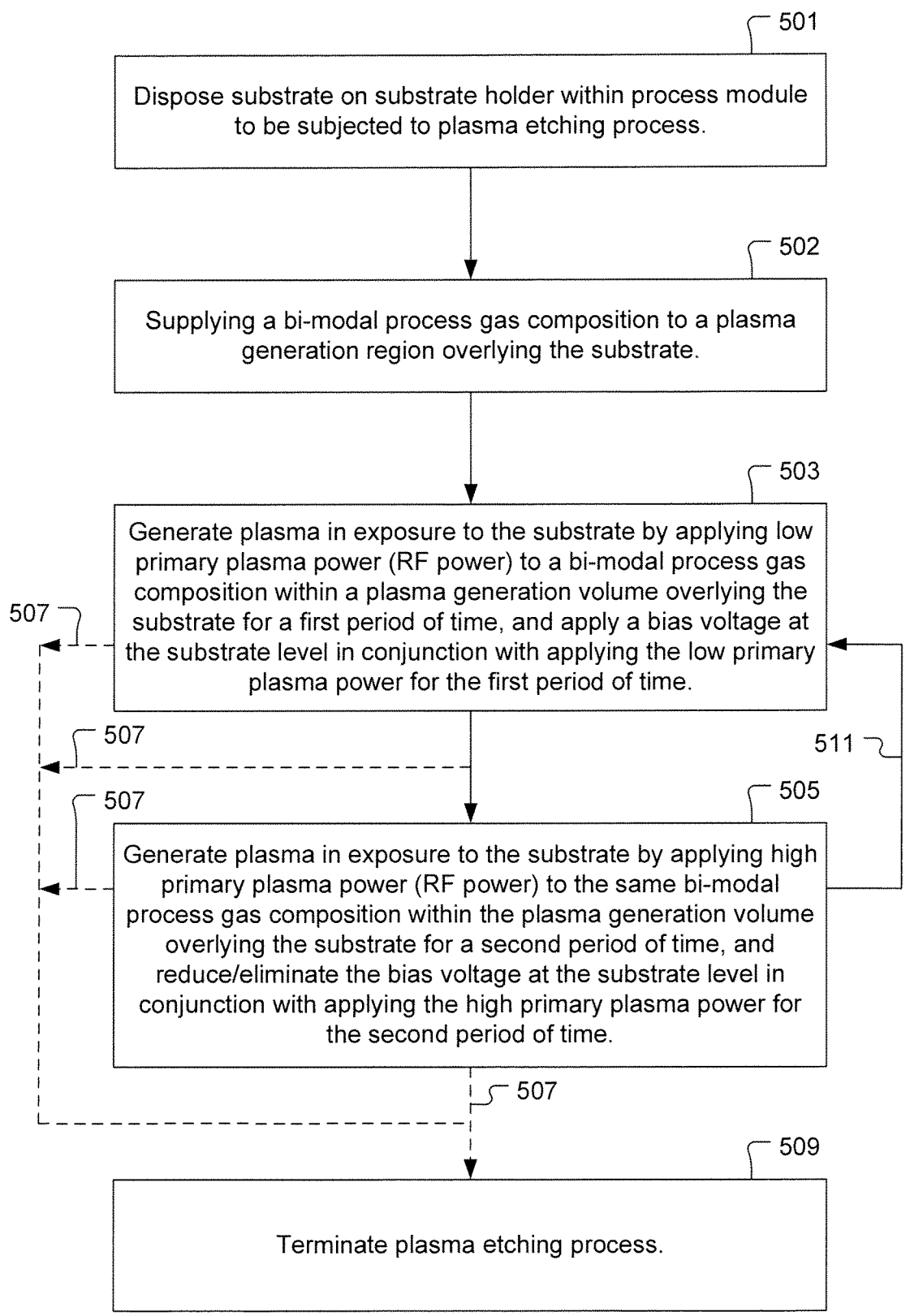
FIG. 5A shows a flowchart of a method for using the bi-modal process gas composition in plasma etching of target material in conjunction with use of bias voltage, in accordance with some embodiments of the present invention.

FIG. 5A shows a flowchart of a method for using the bi-modal process gas composition in plasma etching of target material in conjunction with use of bias voltage, in accordance with some embodiments of the present invention. With reference to FIG. 2, the method includes an operation 501 in which a substrate 101 is disposed on a substrate holder 102 within a process module 100 to be subjected to a plasma etching process. As exemplified in FIG. 1A, the substrate 101 includes the mask material 154 disposed over the target material 152, with portions of the target material 152 exposed through openings in the mask material 154. The method also includes an operation 502 for supplying the bi-modal process gas composition to the plasma generation region 104A overlying the substrate 101. The method also includes an operation 503 for generating a plasma in exposure to the substrate 101 by applying low primary plasma power (RF power) to the bi-modal process gas composition within the plasma generation region 104A overlying the substrate 101 for a first period of time. Also, operation 503 includes applying a bias voltage at the substrate 101 level in conjunction with applying the low primary plasma power to the bi-modal process gas composition for the first period of time. In some embodiments, the bias voltage is applied in operation 503 within a voltage range extending up to about 5000 V. In some embodiments, the bias voltage is applied in operation 503 within a voltage range extending up to about 3000 V. In some embodiments, the bias voltage is applied in operation 503 within a voltage range extending from about 100 V to about 5000 V. In some embodiments, the bias voltage is applied in operation 503 within a voltage range extending from about 200 V to about 3000 V. The bias voltage applied in operation 503 serves to attract ions/charged constituents of the plasma toward the substrate 101 in a more direct manner, and serves to increase a kinetic energy of the ions/charged constituents in transit from the plasma toward the substrate 101, and serves to increase an ion/charged constituent density within the plasma near the substrate 101.

In some embodiments, the low primary plasma power applied during operation 503 is within a range extending from about 100 W to about 1000 W. In some embodiments, the low primary plasma power applied during operation 503 is within a range extending from about 300 W to about 600 W. In some embodiments, the low primary plasma power applied during operation 503 is about 500 W. Also, in some embodiments, a duration of the first period of time is within a range extending from about 0.1 ms to about 1000 ms. Operation 503 corresponds to a first process state that is an etching-dominant process state in which the target material 152 is etched. In the etching-dominant process state of operation 503, some mask material 154 will likely be removed due to the lower etching selectivity of the target material 152 relative to a mask material 154, and due to the application of bias voltage at the substrate 101 level. In some embodiments, the bi-modal process gas composition is configured such that during operation 503 the activation energy at the etch front, i.e., at the exposed target material 152, is essentially zero.

After completion of the operation 503, the method continues with an operation 505 for generating the plasma in exposure to the substrate 101 by applying high primary plasma power (RF power) to the bi-modal process gas composition within the plasma generation region 104A overlying the substrate 101 for a second period of time. Also, operation 505 includes reducing/eliminating the bias voltage at the substrate 101 level in conjunction with applying the high primary plasma power to the bi-modal gas composition for the second period of time. In some embodiments, the bias voltage applied at the substrate level in operation 505 is less than a threshold bias voltage required for removal of the mask material 154. In some embodiments, the bias voltage applied at the substrate level in operation 505 is zero. It should be understood that the bi-modal process gas composition present in operation 505 is the same bi-modal process gas composition present in operation 503. Therefore, the method of FIG. 5A is not an MMP method in which the process gas composition is changed between process pulses. In some embodiments, the high primary plasma power applied during operation 505 is within a range extending from about 750 W to about 6000 W. In some embodiments, the high primary plasma power applied during operation 505 is within a range extending from about 1000 W to about 4000 W. In some embodiments, the high primary plasma power applied during operation 505 is about 2500 W. Also, in some embodiments, a duration of the second period of time is within a range extending from about 0.1 ms to about 1000 ms.

Operation 505 corresponds to a second process state that is a deposition-dominant process state in which material is deposited on the mask material 154 to repair/rebuild mask material 154 that was removed during the etching-dominant process state of operation 503. In some embodiments, the bi-modal process gas composition is configured such that during operation 505 the activation energy at the etch front, i.e., at the exposed target material 152, is increased relative to its value during operation 503. From operation 505, the method reverts back to operation 503, as indicated by arrow 511, to again apply low primary plasma power (RF power) to the bi-modal process gas composition within the plasma generation region 104A overlying the substrate 101 so as to expose the substrate 101 to the etching-dominant process state in which the target material 152 is etched. As indicated by arrows 507 directed to a termination operation 509, the plasma etching process can be terminated at any time, either during operation 503, or at the end of operation 503, or during operation 505, or at the end of operation 505, when a desired etching of the target material 152 has been achieved.

Figure 5B:
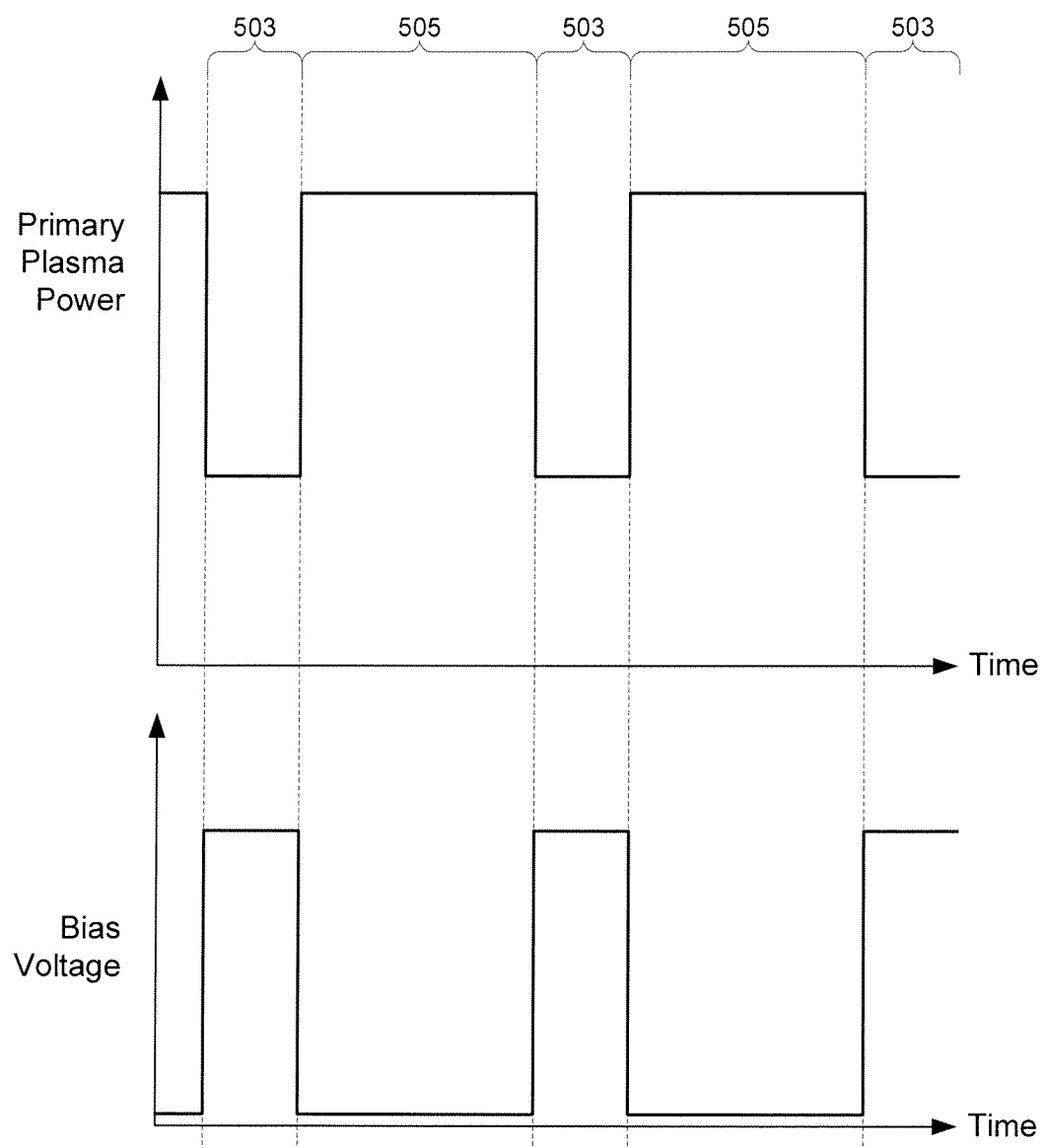
FIG. 5B shows a plot of applied primary plasma power as a function of time in accordance with the method of FIG. 5A, in accordance with some embodiments of the present invention.

FIG. 5B shows a plot of applied primary plasma power as a function of time in accordance with the method of FIG. 5A, in accordance with some embodiments of the present invention. The plot shows the duration of the first period of time in which operation 503 is performed and in which the plasma is in the first process state that is the etching-dominant process state and in which the bias voltage is applied at the substrate level. The plot also shows the duration of the second period of time in which operation 505 is performed and in which the plasma is in the second process state that is the deposition-dominant process state and in which the bias voltage is reduced/eliminated. In this particular example, the first period of time corresponding to the etching-dominant process state is less than the second period of time corresponding to the deposition-dominant process state. This type of duty cycle for etching versus deposition can be utilized in processing applications in which the removal rate of mask material 154 is significant during the etching-dominant process state, such as when the bias voltage is applied at the substrate level during the etching-dominant process state of operation 503. In some example embodiments, the first period of time corresponding to the etching-dominant process state may be about one-third of the second period of time corresponding to the deposition-dominant process state. However, in other embodiments, the respective durations of the first period of time for the etching-dominant process state and the second period of time for the deposition-dominant process state can be set in essentially any manner necessary to preserve/maintain a sufficient amount of mask material 154 in order to achieve a desired etching result of the target material 152.

In an example embodiment, the method of FIG. 5A is applied using a bi-modal process gas composition of 80 sccm $CHF_3$+20 sccm $NF_3$, where sccm is a standard cubic centimeter per minute flow rate. With this example bi-modal process gas composition, the plasma will exhibit etching-dominant effects at low primary plasma power and deposition-dominant effects at high plasma power. More specifically, at low primary plasma power, the dissociation rate of the $NF_3$ component is higher so that $NF_3$ dominates and etching is the dominant effect on the substrate. And, at high primary plasma power, the dissociation rate of the $CHF_3$ component is higher so that the $CHF_3$ dominates and deposition is the dominant effect on the substrate.

Figure 5C:
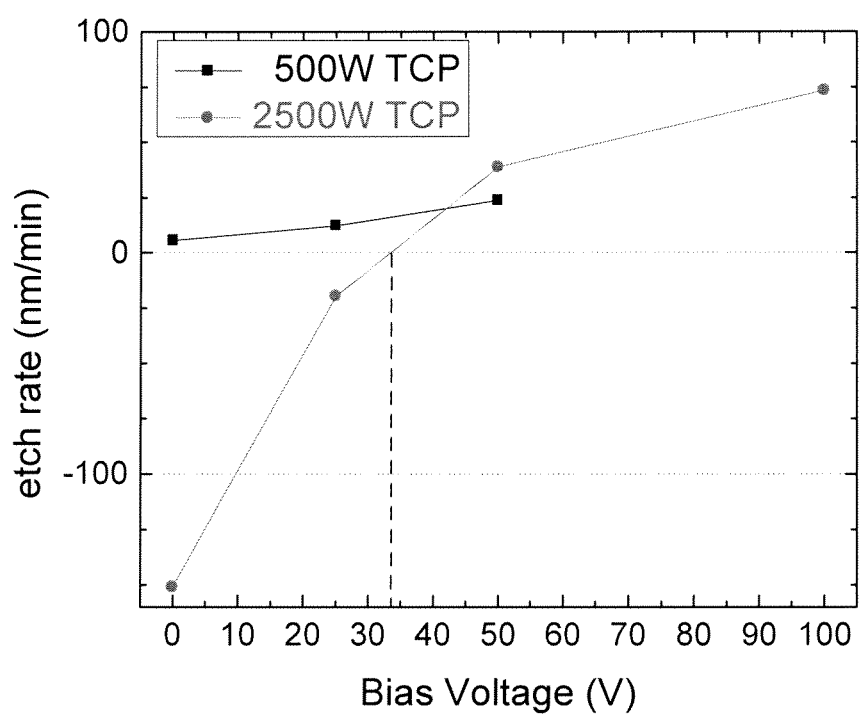
FIG. 5C shows an example plot of blanket oxide etch rate as a function of applied bias voltage in response to different applied primary plasma powers, in accordance with some embodiments of the present invention.

FIG. 5C shows an example plot of blanket oxide etch rate as a function of applied bias voltage in response to different applied primary plasma powers, in accordance with some embodiments of the present invention. The plasma used to generate the example plots of FIG. 5C was generated at 10 milliTorr, using the bi-modal process gas composition of 80 sccm $CHF_3$+20 sccm $NF_3$. The low primary plasma power applied in operation 503 was 500 W, with the corresponding etch rate versus bias voltage response indicated by the 500 W TCP curve. The high primary plasma power applied in operation 505 was 2500 W, with the corresponding etch rate versus bias voltage response indicated by the 2500 W TCP curve. FIG. 5C shows that with application of the low primary plasma power in operation 503, etching occurs with zero bias voltage applied. Therefore, with application of the low primary plasma power in operation 503, the required activation energy is zero, and the oxide will spontaneously etch in the presence of the plasma, and etch even more with applied bias voltage. In this sense, the bi-modal process gas composition of 80 sccm $CHF_3$+20 sccm $NF_3$ represents a lean chemistry at low primary plasma power. However, with application of the high primary plasma power in operation 505, there is an activation threshold of about 33 V required for etching to occur. Below this activation threshold of about 33 V, no etching will occur, thereby allowing for deposition to occur. In this sense, the bi-modal process gas composition of 80 sccm $CHF_3$+20 sccm $NF_3$ represents a non-lean chemistry at high primary plasma power.

In the example of FIG. 5C, when the primary plasma power is low in the operation 503, etching of the blanket oxide is occurring, and the bias voltage is applied to enhance the etching directionality. Then, when the primary plasma power is high in the operation 505, deposition of material on the blanket oxide is occurring, and the bias voltage is turned off to avoid interference with the material deposition. Therefore, FIG. 5C demonstrates that with an appropriate configuration of the bi-modal process gas composition, use of low primary plasma power in conjunction with increased bias voltage, such as in operation 503, can provide for improvement in ARDE. And, use of high primary plasma power in conjunction with low/zero bias voltage, such as in operation 505, can provide for deposition of material (such as polymer material) on the mask material 154 in order to repair/rebuild the mask material 154. It should be understood that the bi-modal process gas composition of 80 sccm $CHF_3$+20 sccm $NF_3$ as disclosed with regard to FIG. 5C is provided by way of example and should not be construed as limiting to the methods disclosed herein.

In various embodiments, essentially any bi-modal process composition can be formulated and utilized so long as the resulting plasma exhibits etching-dominant effects at one primary plasma power level and exhibits deposition-dominant effects at another different primary plasma power level. Also, while the examples of FIG. 4B and FIG. 5B show the plasma exhibiting the etching-dominant effects at the low primary plasma power level and exhibiting the deposition-dominant effects at the high primary plasma power level, it should be understood that this relationship may be reversed with other bi-modal process gas compositions. Specifically, with some bi-modal process gas compositions, the plasma will exhibit the etching-dominant effects at the high primary plasma power level and exhibit the deposition-dominant effects at the low primary plasma power level. For example, a plasma generated using a bi-modal process gas composition of 10 sccm $SiCl_4$+1000 sccm $O_2$, will exhibit deposition-dominant effects at a low primary plasma power level of about 100 W, and will exhibit etching-dominant effects at a high primary plasma power level of about 3000 W. Again, it should be understood that the bi-modal process gas composition of 10 sccm $SiCl_4$+1000 sccm $O_2$ as mentioned here is provided by way of example and should not be construed as limiting to the methods disclosed herein.

The methods disclosed herein provide for plasma etching processes in which a single bi-modal process gas composition provides for generation of a plasma of lean chemistry (zero activation energy) at a first primary plasma power level, and transitions the plasma into a polymerizing chemistry (non-zero activation energy) at a second primary plasma power level that is different than the first primary plasma power level. In some embodiments, the first primary plasma power level is a low primary plasma power level, and the second primary plasma power level is a high primary plasma power level. In some embodiments, the first primary plasma power level is a high primary plasma power level, and the second primary plasma power level is a low primary plasma power level. Fast switching between the first primary plasma power level and the second primary plasma power level enables fast switching between an etching-dominant plasma state and a deposition-dominant plasma state. It should be appreciated that in accordance with the methods disclosed herein the transition between the etching-dominant plasma state and a deposition-dominant plasma state can be done very fast by changing the applied primary plasma power while using the same bi-modal process gas composition, as compared to a much slower transition capability available using the MMP process in which the process gas composition is changed to cause a transition in the plasma state. Therefore, when compared with MMP approaches, the methods disclosed herein can improve substrate processing throughput. Also, the methods disclosed herein can provide better process control by synchronizing primary plasma power with applied bias voltage level in a pulsed manner using the RF power supplies 107 and 125 as discussed with regard to FIG. 2, and FIG. 5B, by way of example.

The methods disclosed herein address issues associated with etching selectivity of the target material 152 relative to the overlying mask material 154 by providing for mask protection without requiring use of multiple different process gas compositions. The methods disclosed herein also show a natural selectivity improvement with an existing "lean" or "polymer rich" process, by switching primary plasma power levels and bias voltage levels in a synchronized manner. The methods disclosed herein provide benefit in etching very HAR features (e.g., features having aspect ratios of 30-to-1, or greater), where regular etch chemistry (very polymerizing with selectivity limitation) slows down or stops etching, due to less ion energy at etch front and eventually not enough ion energy to activate bottom etch of the HAR features. However, it should be understood that the methods disclosed herein are not limited to etching HAR features, and can provide benefit in essentially any plasma etching application where it is of interest/necessity to repair/rebuild mask material 154 during the plasma etching process.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A method for plasma etching of a target material in semiconductor fabrication, comprising:
   (a) disposing a substrate on a substrate holder within a process module, wherein the substrate includes a mask material overlying a target material with at least one portion of the target material exposed through an opening in the mask material;
   (b) supplying a bi-modal process gas composition to a plasma generation region overlying the substrate;
   (c) for a first period of time, applying a first radiofrequency power to the bi-modal process gas composition within the plasma generation region to generate a plasma in exposure to the substrate, the plasma generated through application of the first radiofrequency power causing etching-dominant effects on the substrate;
   (d) for a second period of time, after completion of the first period of time, applying a second radiofrequency power to the bi-modal process gas composition within the plasma generation region to generate the plasma in exposure to the substrate, wherein the second radiofrequency power is applied instead of the first radiofrequency power, the plasma generated through application of the second radiofrequency power causing deposition-dominant effects on the substrate; and
   (e) repeating operations (c) and (d) in an alternating and successive manner for an overall period of time necessary to remove a required amount of the target material exposed on the substrate.

2. The method as recited in claim 1, wherein the bi-modal process gas composition includes an etchant species and a deposition species, wherein the etchant species is configured to provide the etching-dominant effects on the substrate during the first period of time of operation (c), and wherein the deposition species is configured to provide the deposition-dominant effects on the substrate during the second period of time of operation (d).

3. The method as recited in claim 2, wherein the bi-modal process gas composition is configured such that a dissociation rate of the etchant species is higher than a dissociation rate of the deposition species during the first period of time of operation (c), and wherein the bi-modal process gas composition is configured such that a dissociation rate of the deposition species is higher than a dissociation rate of the etchant species during the second period of time of operation (d).

4. The method as recited in claim 1, wherein the first radiofrequency power applied during the first period of time of operation (c) is less than the second radiofrequency power applied during the second period of time of operation (d).

5. The method as recited in claim 1, wherein the first radiofrequency power applied during the first period of time of operation (c) is greater than the second radiofrequency power applied during the second period of time of operation (d).

6. The method as recited in claim 1, wherein a lower one of the first radiofrequency power and the second radiofrequency power is within a range extending from about 100 Watts (W) to about 1000 W, or within a range extending from about 300 W to about 600 W, or about 500 W.

7. The method as recited in claim 6, wherein a higher one of the first radiofrequency power and the second radiofrequency power is within a range extending from about 750 Watts (W) to about 6000 W, or within a range extending from about 1000 W to about 4000 W, or about 2500 W.

8. The method as recited in claim 1, wherein a duration of the first period of time is less than a duration of the second period of time.

9. The method as recited in claim 1, wherein a duration of the first period of time is about one-third a duration of the second period of time.

10. The method as recited in claim 1, wherein the etching-dominant effects on the substrate caused by application of the first radiofrequency power to the plasma include etching of the at least one portion of the target material exposed through the opening in the mask material and removal of some of the mask material, and wherein the deposition-dominant effects on the substrate caused by application of the second radiofrequency power to the plasma include deposition of polymer material on the mask material.

11. A method for plasma etching of a target material in semiconductor fabrication, comprising:

(a) disposing a substrate on a substrate holder within a process module, wherein the substrate includes a mask material overlying a target material with at least one portion of the target material exposed through an opening in the mask material;

(b) supplying a bi-modal process gas composition to a plasma generation region overlying the substrate;

(c) for a first period of time, applying a first radiofrequency power to the bi-modal process gas composition within the plasma generation region to generate a plasma in exposure to the substrate, the plasma generated through application of the first radiofrequency power causing etching-dominant effects on the substrate, and applying a bias voltage at the substrate holder at a first bias voltage setting;

(d) for a second period of time, after completion of the first period of time, applying a second radiofrequency power to the bi-modal process gas composition within the plasma generation region to generate the plasma in exposure to the substrate, wherein the second radiofrequency power is applied instead of the first radiofrequency power, the plasma generated through application of the second radiofrequency power causing deposition-dominant effects on the substrate, and reducing the bias voltage at the substrate holder to a second bias voltage setting; and (e) repeating operations (c) and (d) in an alternating and successive manner for an overall period of time necessary to remove a required amount of the target material exposed on the substrate.

12. The method as recited in claim 11, wherein the first bias voltage setting is within a range extending up to about 5000 Volts (V), or within a range extending up to about 3000 V, or within a range extending from about 100 V to about 5000 V, or within a range extending from about 200 V to about 3000 V.

13. The method as recited in claim 12, wherein the second bias voltage setting is less than a threshold, bias voltage required for removal of the mask material.

14. The method as recited in claim 12, wherein the second bias voltage setting is zero.

15. The method as recited in claim 11, wherein the bi-modal process gas composition includes an etchant species and a deposition species, wherein the etchant species is configured to provide the etching-dominant effects on the substrate during the first period of time of operation (c), and wherein the deposition species is configured to provide the deposition-dominant effects on the substrate during the second period of time of operation (d).

16. The method as recited in claim 15, wherein the bi-modal process gas composition is configured such that a dissociation rate of the etchant species is higher than a dissociation rate of the deposition species during the first period of time of operation (c), and wherein the bi-modal process gas composition is configured such that a dissociation rate of the deposition species is higher than a dissociation rate of the etchant species during the second period of time of operation (d).

17. The method as recited in claim 11, wherein the first radiofrequency power applied during the first period of time of operation (c) is less than the second radiofrequency power applied during the second period of time of operation (d).

18. The method as recited in claim 11, wherein the first radiofrequency power applied during the first period of time of operation (c) is greater than the second radiofrequency power applied during the second period of time of operation (d).

19. The method as recited in claim 11, wherein a duration of the first period of time is less than a duration of the second period of time.

20. The method as recited in claim 11, wherein the etching-dominant effects on the substrate caused by application of the first radiofrequency power to the plasma include etching of the at least one portion of the target material exposed through the opening in the mask material and removal of some of the mask material, and wherein the deposition-dominant effects on the substrate caused by application of the second radiofrequency power to the plasma include deposition of polymer material on the mask material.

* * * * *

UNITED STATES PATENT AND TRADEMARK OFFICE
CERTIFICATE OF CORRECTION

PATENT NO. : 9,691,625 B2  
APPLICATION NO. : 14/932265  
DATED : June 27, 2017  
INVENTOR(S) : Tan et al.

Page 1 of 1

It is certified that error appears in the above-identified patent and that said Letters Patent is hereby corrected as shown below:

On the Title Page

Item (72) Inventors, should read:  
--(72) Inventors: Zhongkui Tan, San Jose, CA (US); Qian Fu, Pleasanton, CA (US); Ying Wu, Dublin, CA (US); Qing Xu, Fremont, CA (US); Hua Xiang, Pleasanton, CA (US)--.

Signed and Sealed this  
Fourteenth Day of August, 2018

Andrei Iancu  
*Director of the United States Patent and Trademark Office*